United States Patent
Yoo

(10) Patent No.: US 7,459,373 B2
(45) Date of Patent: Dec. 2, 2008

(54) METHOD FOR FABRICATING AND SEPARATING SEMICONDUCTOR DEVICES

(75) Inventor: Myung Cheol Yoo, Pleasanton, CA (US)

(73) Assignee: Verticle, Inc., Dublin, CA (US)

( * ) Notice: Subject to any disclaimer, the term of this patent is extended or adjusted under 35 U.S.C. 154(b) by 306 days.

(21) Appl. No.: 11/280,142

(22) Filed: Nov. 15, 2005

(65) Prior Publication Data

US 2006/0105542 A1   May 18, 2006

Related U.S. Application Data

(60) Provisional application No. 60/628,378, filed on Nov. 15, 2004.

(51) Int. Cl.
*H01L 21/44* (2006.01)
(52) U.S. Cl. .................. 438/455; 438/434; 438/456; 438/478; 438/676; 438/788; 257/E21.175; 257/E21.508; 257/E21.238
(58) Field of Classification Search ................. 438/455; 156/273.5; 257/E21.175, E21.508, E21.238
See application file for complete search history.

(56) References Cited

U.S. PATENT DOCUMENTS

| | | | |
|---|---|---|---|
| 3,453,722 A * | 7/1969 | Abraham et al. ............ | 438/404 |
| 4,999,694 A | 3/1991 | Austin et al. | |
| 5,331,180 A | 7/1994 | Yamada et al. | |
| 5,912,477 A | 6/1999 | Negley | |
| 5,990,495 A | 11/1999 | Ohba | |
| 6,130,016 A * | 10/2000 | Kent ........................... | 430/30 |
| 6,187,606 B1 | 2/2001 | Edmond et al. | |
| 6,201,262 B1 | 3/2001 | Edmond et al. | |
| 6,232,623 B1 | 5/2001 | Morita | |
| 6,281,867 B2 | 8/2001 | Kurematsu et al. | |
| 6,455,340 B1 | 9/2002 | Chua et al. | |
| 6,459,100 B1 | 10/2002 | Doverspike et al. | |
| 6,562,648 B1 | 5/2003 | Wong et al. | |
| 6,610,551 B1 | 8/2003 | Doverspike et al. | |

(Continued)

FOREIGN PATENT DOCUMENTS

JP        2002005421 A        1/2005

OTHER PUBLICATIONS

International Preliminary Report on Patentability, mailed Jan. 4, 2007, for International Application No. PCT/US2004/017297; filed on Jun. 3, 2004; Applicant: Yoo, Myung Cheol.

(Continued)

*Primary Examiner*—Michael S Lebentritt
(74) *Attorney, Agent, or Firm*—IP Strategy Group, P.C.

(57) ABSTRACT

A method of fabricating and separating semiconductor structures comprises the steps of: (a) partially forming a semiconductor structure attached to a support structure, the partially formed semiconductor structure comprising a plurality of partially formed devices, where the partially formed devices are attached to one another by at least one connective layer; (b) forming a partial mask layer over at least a part of the partially formed devices; (c) etching the connective layer to separate the devices; and (d) removing the partial mask layer. Advantages of the invention include higher yield than conventional techniques. In addition, less expensive equipment can be used to separate the devices. The result is a greater production of devices per unit of time and per dollar.

21 Claims, 14 Drawing Sheets

U.S. PATENT DOCUMENTS

| | | | |
|---|---|---|---|
| 6,713,789 | B1 | 3/2004 | Shibata et al. |
| 6,744,196 | B1 | 6/2004 | Jeon |
| 6,756,614 | B2 | 6/2004 | Hatano et al. |
| 7,015,117 | B2 * | 3/2006 | Urbanek .................. 438/458 |
| 7,105,857 | B2 | 9/2006 | Nagahama et al. |
| 7,250,638 | B2 | 7/2007 | Lee et al. |
| 2001/0010941 | A1 | 8/2001 | Morita |
| 2001/0042866 | A1 | 11/2001 | Coman et al. |
| 2002/0001943 | A1 | 1/2002 | Akram |
| 2002/0036295 | A1 | 3/2002 | Nunoue et al. |
| 2002/0050596 | A1 | 5/2002 | Otsuka et al. |
| 2002/0052076 | A1 | 5/2002 | Khan et al. |
| 2002/0053676 | A1 | 5/2002 | Kozaki |
| 2002/0056914 | A1 | 5/2002 | Akram |
| 2002/0098711 | A1 | 7/2002 | Klein et al. |
| 2002/0102819 | A1 | 8/2002 | Tamura et al. |
| 2002/0102830 | A1 | 8/2002 | Ishida |
| 2002/0106879 | A1 | 8/2002 | Akram |
| 2002/0117677 | A1 | 8/2002 | Okuyama et al. |
| 2002/0146855 | A1 | 10/2002 | Goto et al. |
| 2002/0182889 | A1 | 12/2002 | Solomon et al. |
| 2003/0006429 | A1 | 1/2003 | Takahashi et al. |
| 2003/0010975 | A1 | 1/2003 | Gibb et al. |
| 2003/0040133 | A1 | 2/2003 | Horng et al. |
| 2003/0047129 | A1 | 3/2003 | Kawahara et al. |
| 2003/0062530 | A1 | 4/2003 | Okazaki et al. |
| 2003/0080344 | A1 | 5/2003 | Yoo |
| 2003/0114017 | A1 | 6/2003 | Wong et al. |
| 2003/0122141 | A1 | 7/2003 | Wong et al. |
| 2003/0139037 | A1 | 7/2003 | Kobayashi et al. |
| 2003/0189212 | A1 | 10/2003 | Yoo |
| 2003/0189215 | A1 | 10/2003 | Lee et al. |
| 2003/0190770 | A1 | 10/2003 | Yeom et al. |
| 2003/0230757 | A1 | 12/2003 | Suehiro et al. |
| 2004/0072383 | A1 | 4/2004 | Nagahama et al. |
| 2004/0245543 | A1 | 12/2004 | Yoo |
| 2004/0266043 | A1 * | 12/2004 | Oohata et al. .................. 438/46 |
| 2005/0082543 | A1 | 4/2005 | Alizadeh et al. |
| 2005/0189551 | A1 | 9/2005 | Peng et al. |
| 2005/0242365 | A1 | 11/2005 | Yoo |
| 2006/0006554 | A1 | 1/2006 | Yoo |
| 2006/0148115 | A1 | 7/2006 | Yoo |
| 2007/0221944 | A1 | 9/2007 | Yoo |

OTHER PUBLICATIONS

International Written Opinion, mailed Nov. 22, 2006, for International Application No. PCT/US2004/017297; filed on Jun. 3, 2004; Applicant: Yoo, Myung Cheol.

International Search Report, mailed Nov. 22, 2006, for International Application No. PCT/US2004/017297; filed on Jun. 3, 2004; Applicant: Yoo, Myung Cheol.

"Notice of Office Action," mailed Nov. 29, 2005, for U.S. Appl. No. 10/861,743, filed Jun. 3, 2004; Inventors: Yoo, Myung Cheol.

"Notice of Office Action," mailed Jun. 14, 2006, for U.S. Appl. No. 10/861,743, filed Jun. 3, 2004; Inventors: Yoo, Myung Cheol.

"Notice of Office Action," mailed Jun. 4, 2007, for U.S. Appl. No. 10/861,743, filed Jun. 3, 2004; Inventors: Yoo, Myung Cheol.

"Notice of Office Action," mailed Jan. 4, 2007, for U.S. Appl. No. 10/861,743, filed Jun. 3, 2004; Inventors: Yoo, Myung Cheol.

"Notice of Office Action," mailed Sep. 27, 2006, for U.S. Appl. No. 11/117,084, filed Apr. 27, 2005; Inventors: Yoo.

"Notice of Office Action," mailed Apr. 3, 2007, for U.S. Appl. No. 11/117,084, filed Apr. 27, 2005; Inventors: Yoo.

International Search Report, mailed Oct. 2, 2006, for International Application No. PCT/US2005/22785; filed on Jun. 22, 2005; Applicant: Verticle.

International Written Opinion, mailed Oct. 2, 2006, for International Application No. PCT/US2005/22785; filed on Jun. 22, 2005; Applicant: Verticle.

"Non-Final Office Action", date mailed Nov. 15, 2007, U.S. Appl. No. 11/165,110, filed Jun. 22, 2005; Applicant: Verticle.

"Written Opinion", date mailed Dec. 7, 2007, International Application No. PCT/US05/22785; Filed on Jun. 22, 2005; Applicant: Verticle.

"Continuous-Wave Operation of InGaN Multiple-Quantum-Well Laser Diodes on Copper Substrates Obtained by Laser Liftoff," Mar./Apr. 2001, IEEE Journal on Selected Topics in Quantum Electronics, vol. 7, No. 2.

Wong, et al. "Continuous-Wave InGaN Multiple-Quantum-Well Laser Diodes on Copper Substrates," Feb. 26, 2001, Applied Physics Letters vol. 78, No. 9. http://apl.aip.org/copyright.jsp.

"The Integration of $In_xGa_{1-x}N$ Multiple-Quantum-Well Laser Diodes with Copper Substrates by Laser Lift-Off," Dec. 1, 2000, Jpn. J. Appl. Phys. vol. 39 (2000) pp. L 1203-L 1205, Part 2, No. 12A.

"International Search Report", Issued PCT Application No.: PCT/US05/14634; Mailing Date: Aug. 4, 2008;.

"Written Opinion", Issued in PCT Application No.: PCT/US05/14634; Mailing Date: Aug. 4, 2008;.

"International Preliminary Report on Patentability", Issued in PCT Application No.: PCT/US/2005/014634; Mailing Date: Sep. 12, 2008;.

"International Search Report", Issued in PCT Application No.: PCT/US2008/065355; Mailing Date: Sep. 29, 2008.

"Written Opinion", Issued in PCT Application No.: PCT/US2008/065355; Mailing Date: Sep. 29, 2008;.

* cited by examiner

Surface Treatment By Dry Etching

METHOD FOR FABRICATING AND SEPARATING SEMICONDUCTOR DEVICES

REFERENCE TO RELATED APPLICATIONS

This application claims the priority right under 35 USC 119(e) from U.S. Provisional Application No. 60/628,378, "Method far Dicing or Scribing-Free Semiconductor Device Separation," filed on Nov. 15, 2004, and also under 35 USC 120 from three U.S. Utility Applications, U.S. application Ser. No. 11/165,110, "Vertical Structure Semiconductor Devices with Improved Light Output," Filed Jun. 22, 2005 (pending), which is a continuation in part of and claiming priority to U.S. application Ser. No. 11/117,084, "Vertical Structure Semiconductor Devices," filed Apr. 27, 2005 (pending), which in turn is a continuation in part of and claiming priority to U.S. application Ser. No. 10/861,743, "Method of Fabricating Vertical Structure Compound Semiconductor Devices." filed Jun. 3, 2004 (pending), which in turn claims priority under 39 USC 119(e) from a U.S. Provisional Application No. 60/476,008, "Method of Fabrication and Vertical Structure Compound Semiconductor Devices." filed Jun. 4, 2003, all of which are incorporated herein by reference.

FIELD

The invention is related to a method for fabricating and separating semiconductor devices. In particular, the invention describes dicing or scribing-free semiconductor device separation, and particularly in a method of fabricating semiconductor devices for opto-electronic applications.

BACKGROUND

Conventional techniques for making and separating semiconductor devices include depositing layers to form numerous semiconductor devices on a wafer substrate and then using mechanical techniques to separate the individual devices. The separation is typically performed by dicing or scribing the substrate to separate the individual devices. Dicing is typically done with a diamond saw, diamond scriber or laser, which is a time consuming process performed by very expensive machines. Several well-known problems exist with conventional techniques including process yield issues, device performance issues and processing cost issues.

FIGS. 1A-C depict conventional semiconductor device separation techniques according to the prior art. FIG. 1A depicts a separation technique by mechanical dicing. FIG. 1B depicts a separation technique by mechanical scribing. FIG. 1C depicts a separation technique by laser scribing.

1. Process Yield Issues

According to conventional mechanical device separation methods, such as dicing and scribing methods, and a laser scribing method, each individual device is separated by cutting along a grid line, or street line, between the devices with the selected method. This is a slow process since each of the street lines is cut one at a time and sequentially Process yield issues become more significant for semiconductor devices having hard substrate materials, such as GaN on sapphire or GaN on SiC materials. Furthermore, the separation yield is greatly affected by any cracks or defects created by substrate grinding and polishing. If the cutting lines pass through defective areas, the result is very low device separation yield.

As a result, device separation is known to be the most tedious and low yield process among the entire semiconductor device fabrication processes. In practical terms, the back-end process yield for the GaN-based semiconductor fabrication is known to be as low as less than 50%, while the front-end fabrication process yield is typically in the range of above 90%.

2. Device Performance Issues

Due to the physical abrasive action of dicing and scribing, the device performance after device separation may be significantly deteriorated. For example, the LED device side wall where the light emits may become damaged due to abrasive cutting action during device separation, which is the main cause of light output reduction after device separation.

In the case of laser scribing, the device separation is accomplished by melting the substrate material with a high intensity laser beam. As a result, the melted substrate material often accumulates on the side wall of the device, which results in lowering light output of the LED device as well.

3. Processing Cost Issues

The average die separation processing time for GaN/sapphire LED device having approximately 10,000~12,000 devices per wafer is approximately 40 min to 1 hour with the conventional separation methods. This means that one device separation machine can handle only 24 to 36 wafers per day (700~1,000 wafers/month) if the machine operates 24 hours/day. In order to achieve a commercially desirable factory output, many machines and significant capital equipment investment is needed.

In addition, the diamond cutting wheels for dicing machine and diamond tips for the scribing machine are very expensive consumable parts, hence there are significant consumable part cost involve with the conventional die separation processes.

In the case of laser scribing, the major consumable part is the laser source. In order to maintain constant laser beam energy, the laser source gas must be recharged regularly. The laser source is the one of the most expensive components in the laser scribing system.

What is needed is an improved technique for fabricating and then separating the devices that is reliable, economical and promotes consistently high device characteristics.

SUMMARY

The invention provides an improved technique for fabricating and then separating semiconductor devices, and particularly in a method of fabricating opto-electronic and electronic semiconductor devices.

An exemplary method of fabricating and separating semiconductor structures comprises the steps of: (a) partially forming a semiconductor structure attached to a support structure, the partially formed semiconductor structure comprising a plurality of partially formed devices, where the partially formed devices are attached to one another by at least one connective layer; (b) forming a partial mask layer over at least a part of the partially formed devices; (c) etching the connective layer to separate the devices; and (d) removing the partial mask layer.

Another exemplary method of fabricating and separating semiconductor structures comprises the steps of: (a) partially forming a semiconductor structure attached to a support structure, the partially formed semiconductor structure comprising a plurality of partially formed devices; (b) forming a mask layer over the surface of the partially formed semiconductor structure, the mask layer formed in a grid pattern leaving openings where each of the devices are desired to be formed; (c) depositing a metal layer over the partially formed semiconductor structure in the openings where the surface is not covered by the masking layer; (d) finishing forming the semiconductor structure; (e) removing the mask layer; and (f) separating the devices proximate to where the mask layer was removed.

Advantages of the invention include higher yield than conventional techniques. In addition, less expensive equipment can be used to separate the devices. The result is a greater production of devices per unit of time and per dollar.

Advantages of the invention include the following.

1. Process yield. The new device separation process does not require any physical abrasive action or heat to remove materials to separate the interconnected device. Multiple numbers of wafers can be separated at once by dipping multiply stacked wafers into processing chemicals. Hence, there is no limitation in the number of wafers to be processed. The device separation process yield can be obtained as high as 95%.

2. Device performance. Since the new process is a chemical process there is no device degradation after device separation. The invention may also reduce the stress build up during the dry etch process by chemical annealing.

3. Cost. The invention does not require expensive capital equipment investment, only inexpensive stripping or etching chemicals are needed along with an inexpensive chemical bath. By using this new die separation method, through-put can be a multiple compared to conventional methods, and process cost per wafer is estimated to be a fraction compared to conventional methods.

BRIEF DESCRIPTION OF THE DRAWINGS

The invention is described with reference to the following figures.

DETAILED DESCRIPTION

The invention is described with reference to specific device structure and embodiments. Those skilled in the art will recognize that the description is for illustration and to provide the best mode of practicing the invention. Numerous process parameters are described for purpose of providing the best mode, while variations of these parameters are anticipated to work well. For example, while the exemplary embodiment describes forming opto-electronic semiconductor devices, the invention is applicable to forming other semiconductor devices as well. As a further example, two methods are described herein in detail. The methods share many common steps and differ on other steps. The description of the first embodiment provides fabrication details that are equally applicable to the second embodiment.

The figures illustrate procedures to fabricate vertical structure GaN-based LEDs using a metal deposition processes to form a metal substrate for mechanical support and electrical conductivity and a laser lift-off (LLO) process to remove the original substrate. The fabrication methods described herein are not limited to LEDs but can also be applied to any device structures, and particularly those containing GaN-based epitaxial thin films grown on the insulating or semi-conductive substrate, such as laser diodes (LD), Hetero-junction Bipolar Transistor (HBT), High Electron Mobility Transistor (HEMT).

Figure 1A:
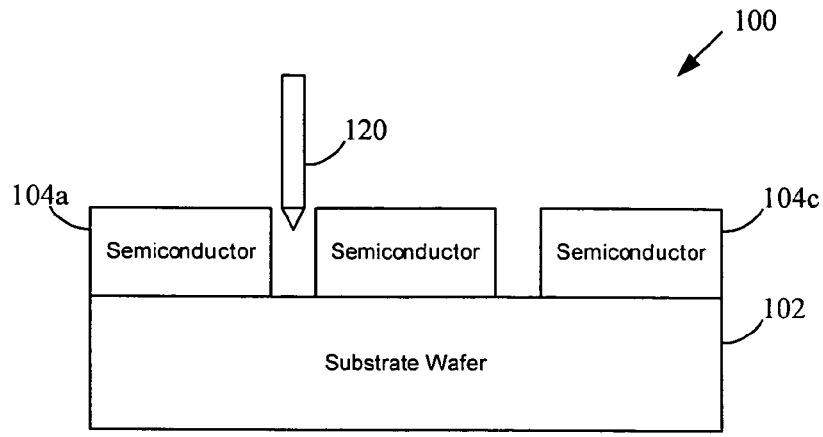
FIGS. 1A-C depict conventional device separation techniques according to the prior art.
Figure 1B:
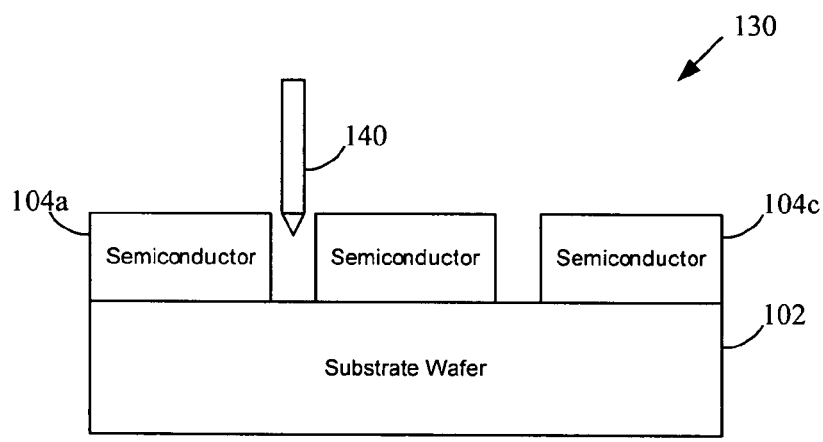
Figure 1C:
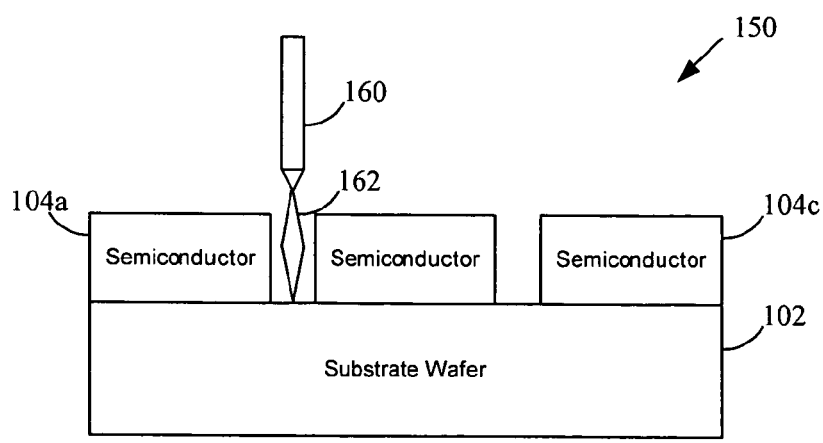
Figure 2:
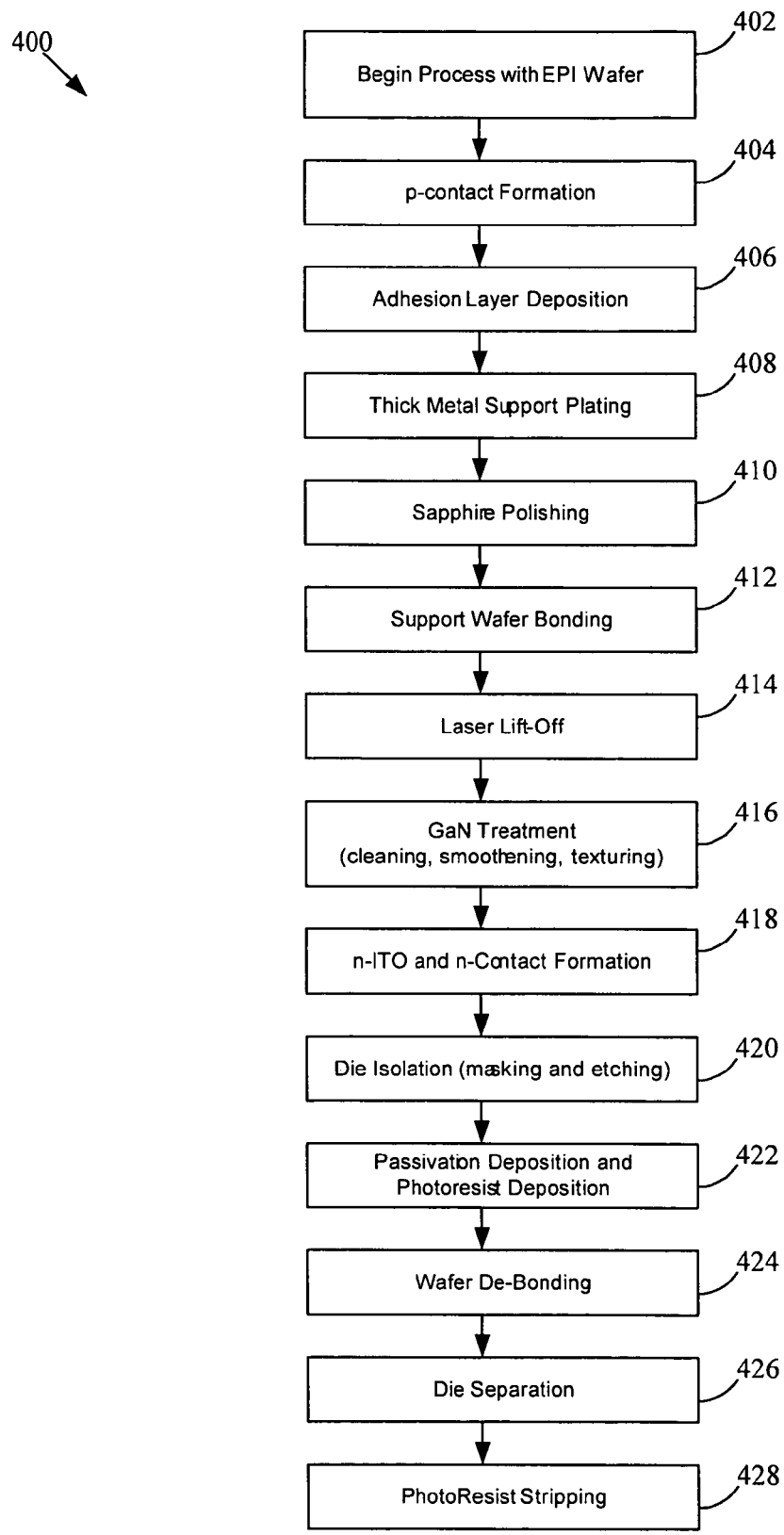
FIG. 2 depicts a flowchart showing steps for performing a method according to an embodiment of the invention.

FIG. 2 depicts a flowchart showing steps for performing a method according to an embodiment of the invention. The process involves masking a partially formed semiconductor structure, plating the structure, and then removing the masking to separate the devices. The steps set forth herein are described in detail with reference to FIGS. 3-16.

Figure 3:
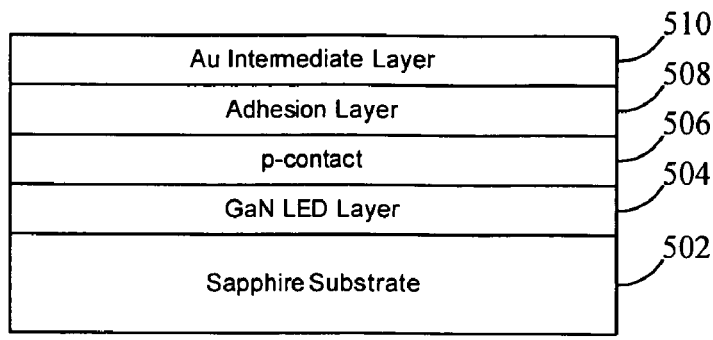
FIG. 3 depicts a partially formed semiconductor structure including an epitaxial wafer grown on a sapphire substrate according to an embodiment of the invention.

FIG. 3 depicts a partially formed semiconductor structure including an epitaxial wafer grown on a sapphire substrate 502 according to an embodiment of the invention. As shown in FIG. 3, the GaN-based LED structure 504 is grown on sapphire substrate 502 with appropriate epitaxial growth apparatus, such as metal organic chemical vapor deposition (MOCVD), molecular beam epitaxy (MBE) or vapor phase epitaxy (VPE), etc. The invention anticipates additional buffer layers employed in fabricating the structure.

After the epitaxial growth, a thin layer of p-contact metal 506 is deposited using thin film deposition methods, such as, electron beam evaporation or sputtering. The p-contact metal can include one or more of the following: Ni/Au, Pd/Ni/Au, Ni/Pd/Au, Pd/Ir/Au, or Pd/Pt/Au. Exemplary the thin film metal layer thicknesses are 10 nm Ni and 20 nm for Ni/Au, 10 nm Pd and 20 nm Ni, 30 nm Au for Pd/Ni/Au, 10 nm Pd, 20 nm Ir, and 30 nm Au for Pd/Ir/Au, and 20 nm Ni and 20 nm Pd, 100 nm Au for Ni//Pd/Au, 10 nm Pd, 20 nm Pt, and 30 nm Au for Pd/Pt/Au, respectively. All p-contact metals are annealed in the furnace at 500° C. for 2 min in oxygen ambient for Ni containing contacts, while non-nickel containing metal contacts are annealed in the nitrogen ambient.

An adhesion layer 508 is also deposited in order to enhance adhesion between the p-contact metal thin film and an Au intermediate layer 510. The adhesion layer is created using in situ Ti or Cr deposited onto p-contact metal thin film with an electron beam evaporator. The film thick is approximately 30~50 nm. To fabricate a vertical structure device having a very thin, hard GaN epi layer (less than 5 µm) with thick and soft metal film support (~50 µm), it is useful to form an intermediate layer in between those two layers to reduce compressive stress build up at the interface between GaN epi layer and metal layers. Approximately 0.7~1 µm thick gold (Au) thin film is deposited consecutively on the Ti or Cr surface using electron beam evaporator without removing wafers from the vacuum chamber. In situ consecutive layer deposition is useful to prevent the oxidation or contaminations, which is useful to make a good thin film adhesion between Ti or Cr and Au layers.

Figure 4:
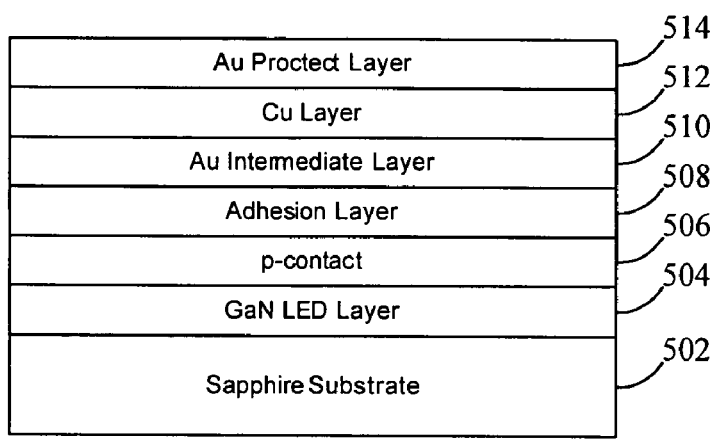
FIG. 4 depicts a partially formed semiconductor structure with metal layers deposited thereon according to an embodiment of the invention.

FIG. 4 depicts a partially formed semiconductor structure with metal layers deposited thereon according to an embodiment of the invention. Thick metal support layers 512 and 514 are deposited by electroplating or electro-less plating. Electroplating or electro-less plating is used because they are fast and inexpensive deposition methods compared to the other deposition methods. This is particularly useful for mass production of vertical light devices in terms of cost effectiveness. The key functions of the metal support layer are that the support layer not only provides a connective layer with good rigid mechanical support for thin GaN epi layer, but also provides good electrical conductivity and heat dissipation. In order to meet these requirements, graded Cu alloy layers are deposited on the Au/Cr or Au/Ti adhesion layer.

With reference to FIG. 4, in one aspect of the invention, two Cu layers are deposited, which include a Cu strike layer prior to a Cu alloy layer in order to promote good adhesion between the thin vacuum evaporated Au layer and the Cu alloy layer. Initially, a sulfate-based soft copper layer is plated in order to gradually soften stress build up due to the thick metal layer deposition. The initial soft Cu layer thickness is set up to ~10 µm. The plating rate is set up to 3~5 µm/hour to form a dense and uniform Cu plating layer. Another reason to choose a slow plating rate is to prevent wafer bowing after de-bonding the wafer from the support wafer carrier. Due to the compressive stress build up at the interface between the GaN epitaxial layer 504 and the copper layer 512, the wafer tends to bow after de-bonding the wafer from the support carrier. In addition to the slow rate plating, organic-base additives are added in the electroplating solution and the sulphonate-base plating solution is used. Furthermore, the electroplating is performed at low temperature (5° C.) to minimize stress build up.

In one aspect, next to the soft Cu layer, a hard Cu layer is plated in order to provide structural stiffness. The plating rate of hard Cu plating is around 15 µm/hour. For the Cu alloy plating, the metal alloy plating solutions containing tin (Sn) and iron (Fe) are mixed with the Cu sulfate solution to improve the mechanical strength and the electrical conductivity of the Cu support layer. The total thickness of the Cu alloy support layer is 50~60 µm. At the end of the Cu alloy plating, 0.3 µm-thick Au layer 514 is electroplated to protect the Cu alloy layers from oxidation. This Au protective layer 514 is useful to promote a good adhesion between the individual die and metal-base epoxy used during the die bonding and wire bonding process for the packaging of the vertical devices.

After the thick Cu metal support is formed by electroplating, the sapphire surface is treated. This includes mechanical polishing to create a uniform roughness of the sapphire surface. The sapphire surface roughness is useful to control the laser beam energy density and the final surface morphology of laser lifted GaN surface. The laser beam energy density is strongly dependent on the surface roughness of the sapphire surface. Low laser beam energy is used if the rough sapphire surface is used for the laser lift-off (LLO) process. However, if the surface is rough, the laser lifted surface looks rough since the surface morphology replicates to the GaN surface after laser lift-off. On the other hand, if a polished surface is used, higher laser beam energy is used. The surface morphology of laser lifted GaN surface is similar to that of polished sapphire surface. However, a higher laser beam usually results in crack generation due to excessive laser beam energy. To obtain a good laser lift-off result and the GaN surface morphology, the surface roughness of the sapphire surface is chosen to be approximately 10~20 angstrom in RMS (root mean square) value.

Figure 5:
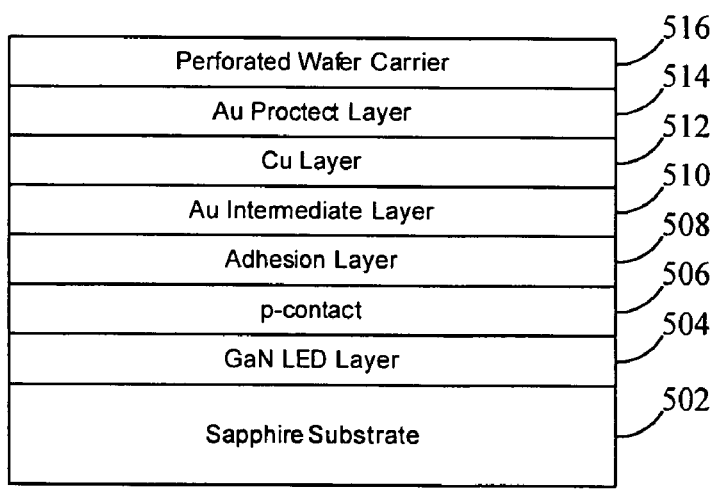
FIG. 5 depicts a partially formed semiconductor structure attached to a perforated wafer carrier according to an embodiment of the invention.

FIG. 5 depicts a partially formed semiconductor structure attached to a perforated wafer carrier 516 according to an embodiment of the invention. In one aspect, the perforated wafer carrier 516 is constructed from stainless steel with small holes. There are two reasons to use a metal wafer carrier. First, it is useful to maintain flatness of the GaN epi wafer after laser lift-off since a very thin epi layer attached to a thick metal substrate tends to bow after sapphire substrate removal, which creates great difficulties in consecutive processing of the laser lifted wafer, such as mask align, dry etching, thin film deposition, and wafer probing. Second, it provides good electrical and heat conduction during the wafer probing and die isolation etching processes. By using the metal wafer carrier, there is no need to remove wafer from the carrier for post processing. In addition, the perforated wafer carrier provides bubble-free wafer bonding since air bubbles can escape easily through the holes during the bonding process. It also promotes an easy de-bonding process between the Sapphire/GaN/Cu/Au wafer and the wafer carrier since the solvent can penetrate easily through the holes during de-bonding process. By using the perforated wafer carrier, the entire process is easy and reliable, which leads to high fabrication yield for the fabrication of the vertical devices. In one example, the thickness of the wafer carrier 516 is 1/16 inches and the diameter is 2.5 inches. The total number of holes is 21 and the through hole diameter is 20/1000 inches. The wafer carrier surface is electro-polished to create a mirror like flat surface for the uniform bonding with the adhesive and for maintaining wafer flatness.

Silver-based conductive adhesives are used to bond the Sapphire/GaN/Cu/Au and the perforated wafer carrier. The conductive adhesive is used to provide good electrical and thermal conduction for the wafer probing and die isolation etching process. In the exemplary embodiment, silver-based conductive thermo-plastic epoxy adhesives are used. The thermo-plastic epoxy is known to have excellent adhesion strength and good heat resistance. Another advantage of the thermo-plastic epoxy is that it can be dissolved in the solvent, such as acetone, which is useful for a de-bonding process.

In this embodiment, sheet-type thermo-plastic epoxy is employed because the film thickness of the sheet type thermo-plastic epoxy is more uniform than that of liquid-based adhesives. The liquid-based adhesives often result in uneven thickness uniformity and bubble formation in the previous bonding process experiences since the spin coating of the liquid-base adhesives generally leads to thicker film formation in the wafer fringe side than that of center area of the wafer. This is quite common phenomena for the liquid-base adhesives to obtain thick adhesive layers by multiple spinning. For the bonding of thermo-plastic epoxy, a 127 µm-thick sheet-type thermo-plastic epoxy is sandwiched between thick metal support 512, 514 and perforated wafer carrier 516. The pressure is set at 10~15 psi and the temperature is maintained at below 200° C. in a hot iso-static press. The bonding time is less than 1 minute. This short bonding time has an advantage over to that of liquid-based adhesives, which typically require more than 6 hours of curing time for the complete curing of the adhesive. The short bonding process time also greatly enhance the productivity of the vertical device fabrication.

Figure 6:
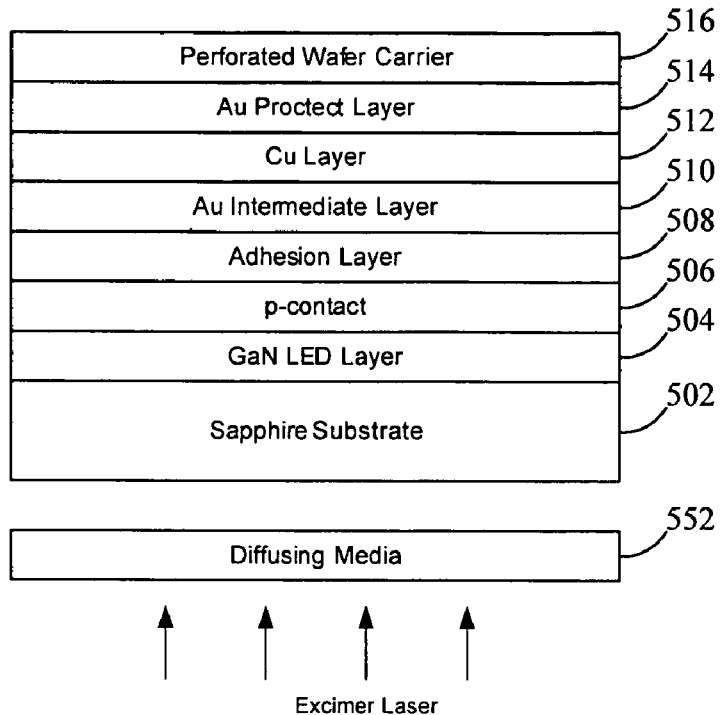
FIG. 6 depicts a technique for performing laser lift-off to remove the sapphire substrate from a partially formed semiconductor structure according to an embodiment of the invention.

Referring to FIG. 6, a 248 nm KrF ultra violet (UV) excimer laser (pulse duration of 38 ns) is used for laser lift-off. The reason for choosing this wavelength is that the laser should beneficially transmit through the sapphire but be absorbed in the GaN epitaxial layer in order to decompose the GaN into metallic Ga and gaseous nitrogen ($N_2$) at the GaN/sapphire interface. The laser beam size is chosen as a 7 mm×7 mm square beam and has beam power density between 600~1,200 $mJ/cm^2$. It is also suggested that the laser beam energy density is dependent on the surface roughness of the sapphire substrate surface. In order to obtain smooth GaN surface after laser lift-off, the beam energy higher than 800 $mJ/cm^2$ was used for the mechanically polished sapphire substrate 10~20 angstrom in RMS (root mean square) value.

Surface roughness of the sapphire substrate is an important process parameter for obtaining a smooth GaN surface after laser lift-off. If un-polished sapphire surface is used during laser lift-off, the GaN surface is rough, which results in poor light output of the LED device due to poor reflectivity of the rough surface after forming a final device. However, if a polished surface is used, a smooth GaN surface can be obtained, hence higher light output can be obtained. However, since the laser beam is localized on the polished sapphire surface, the area irradiated with the higher laser beam power may result in cracking on the GaN surface compared to the area with less laser beam energy. Therefore, it is useful to choose an optimal surface roughness of sapphire wafer in order to obtain a high yield laser lift-off process and a high device performance at the same time. According to conventional techniques, sand blasting is commonly used to obtain uniform laser beam distribution on the polished sapphire surface, however, sand blasting is unreliable and unrepeatable to obtain the identical surface roughness consistently. In the invention, a diffusing media 552 constructed from materials transparent to the 248 nm UV laser is placed in between laser beam and sapphire substrate to obtain uniform laser beam energy distribution on the sapphire surface, hence to enhance the laser lift-off process yield. The RMS (root mean square) surface roughness of the diffusing media is set up less than 30 µm and sapphire was used for the diffuser.

Figure 7:
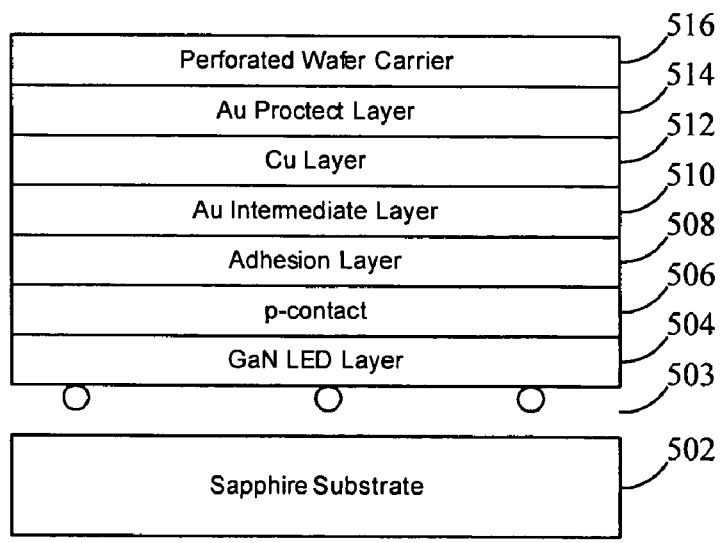
FIG. 7 depicts a technique for performing laser lift-off to remove the sapphire substrate from a partially formed semiconductor structure and also depicts Ga drops on the GaN surface after laser lift-off according to an embodiment of the invention.

Referring to FIG. 7, after laser lift-off, excess Ga drops 503 result from GaN decomposition during laser lift-off, and is cleaned with an HCl solution ($HCl:H_2O=1:1$, at room temperature) or boiled using HCl vapor for 30 seconds. Since the Ga melts at room temperature, Ga is formed in a liquid state during the laser lift-off; hence it can be cleaned with chlorine-based acidic solutions.

Figure 8:
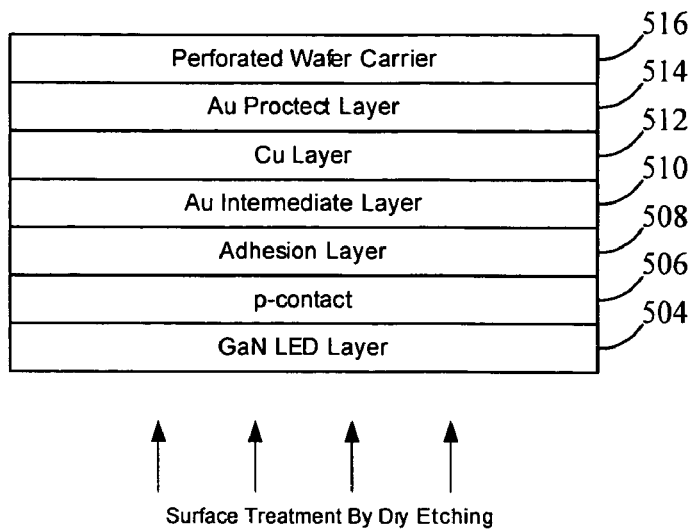
FIG. 8 depicts a technique for treating a GaN LED layer of a partially formed semiconductor structure according to an embodiment of the invention.

FIG. 8 depicts the partially formed semiconductor structure after laser lift-off. In order to expose n-type GaN epitaxial layer, any buffer layers (e.g. GaN, AlN, InN, InGaN and AlGaN) are removed by dry etching, beneficially using inductively coupled reactive ion etching (ICP RIE). The exposed n-GaN surface is further etched to make an atomically flat surface, ICP polishing is also performed on the n-GaN surface. Obtaining a smooth and flat n-GaN surface is particularly useful to form a low resistance metal contact. It is useful to note that the chorine-based gas mixture in the ICP RIE process particularly effective to produce flat n-GaN surface morphology. The ICP etch conditions for this surface smoothening process are as follows:

Total flow rate: 100 sccm
Intensity of magnet field: 15 gauss
Substrate temperature: 70° C.
Gas mixture: 100% $Cl_2$
Power/bias voltage: 600 W/−300V
Operational pressure: 30 mTorr The resulting surface roughness after ICP polishing is less than 10 angstrom in RMS value.

Figure 9:
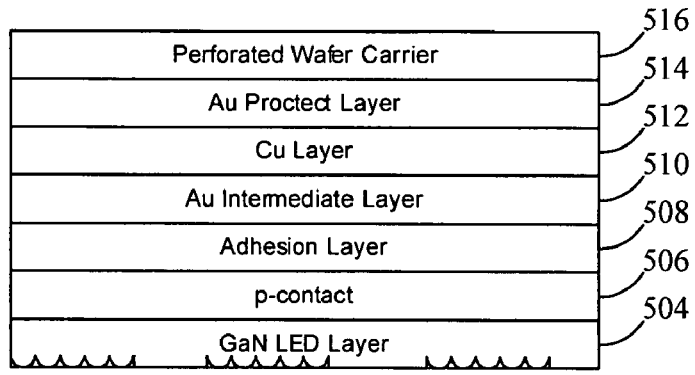
FIG. 9 depicts a partially formed semiconductor structure according to an embodiment of the invention.

Referring to FIG. 9, after the GaN surface smoothening, in one aspect of the invention, the GaN surface is further etched to form a spherical lens-shaped surface morphology. Due to differences in reflective index between GaN and air, photons generated from the GaN semiconductor active layer reflect back to the semiconductor material if the GaN surface is flat.

This internal reflection results in poor light extraction, and may reduce the light output of the device even though plenty of photons are generated in the semiconductor active layer. Therefore, it is beneficial to fabricate the GaN surface with a textured surface morphology in order to reduce the escaping angle of photons by the Snell's law. A spherical lens shape is known to be the most effective over to the other surface textured morphology. ICP RIE is effectively used to fabricate the spherical lens of the GaN surface by modulating etch conditions. The feature size of the spherical lens is approximately 1~5 μm in diameter after ICP etching. The ICP etch conditions for the surface texturing process are as follows:

Total flow rate: 100 sccm
    Intensity of magnet field: 15 gauss
    Substrate temperature: 70° C.
    Gas mixture: 30% $BCl_3$/60% $Cl_2$/10% Ar
    Power/bias voltage: 600 W/−300V
    Operational pressure: 30 mTorr It is further useful that the contact area of n-GaN surface should be protected during the surface texturing etch process in order to maintain a flat n-GaN surface to form a good metal contact. A 6 μm-thick photoresist (PR) film is used to mask the n-contact area prior to the ICP etching. The PR mask is removed after the ICP etching with PR remover or acetone.

Figure 10:
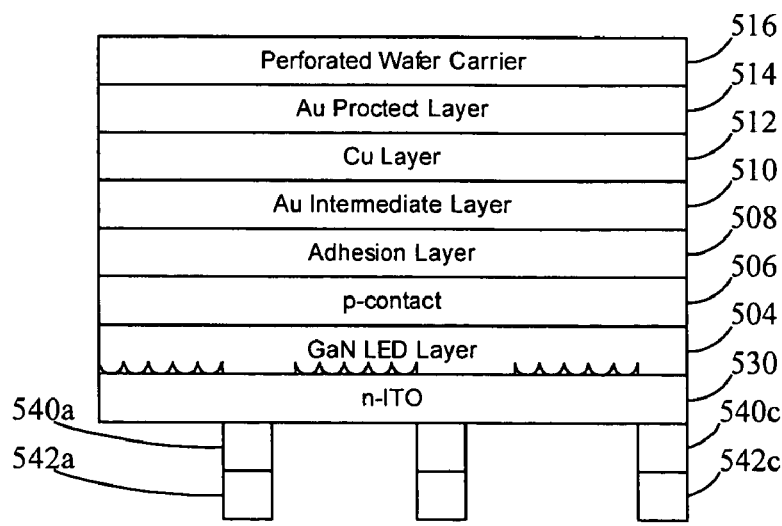
FIG. 10 depicts a partially formed semiconductor structure with contact pads attached thereon according to an embodiment of the invention.

Referring to FIG. 10, in order to improve the current spreading of the vertical device, an n-type ITO transparent contact 530 is formed on the n-GaN LED surface 504. This figure depicts the undulated GaN layer interface with the ITO layer. ITO composition is 10 wt % $SnO_2$/90 wt % $In_2O_3$, and a layer of about 75~200 nm-thick ITO film is deposited using an electron beam evaporator or sputtering system at room temperature. Annealing is carried out after the ITO film deposition in a tube furnace with $N_2$ ambient for 5 minutes. The annealing temperatures are varied in between 300° C. to 500° C. The minimum resistivity of the ITO film is about low $10^{-4}$ Ωcm at 350° C. of annealing temperature in $N_2$ ambient. The transmittances at 460 nm are over 95% at the same annealing temperature.

After the ITO transparent contact formation, an n-contact 540 is formed on the n-ITO surface, comprising Ti and Al. Since multiple contacts are formed, they are referenced as 540a, 540b, 540c and so forth. It is noted that the n-contact is formed at the corner of the device instead of the center of the device. Usually, metal contacts are formed at the center in case of vertical structure device since center contact is the most efficient current path due to its symmetric location. However, contrary to conventional vertical structure devices, it is possible to form a contact at the corner of the device in this new vertical structure device because of the ITO transparent contact already formed underneath the n-type metal contact. By placing a metal contact at the corner, there is no shadowing effect from the bonding pad and bond wires after device packaging, which is the case when an opaque metal contact is located at the center of the device. Therefore, higher light output can be obtained with this new device design. The n-contact 540 comprises Ti and Al. The thicknesses of n-contact metals are 5 nm for Ti, and 200 nm for Al, respectively. In order to make a good adhesion between the n-contact metal layer and the pad metal, 20 nm Cr is deposited on top of the Al as an adhesion layer. For the pad metal deposition, 1 μm-thick gold is deposited on top of the Cr consecutively in the electron beam evaporation chamber without breaking vacuum. In order to form an ohmic contact, the n-contact metal is annealed in the furnace at 250° C. for 10 minutes in a $N_2$ ambient atmosphere.

Figure 11:
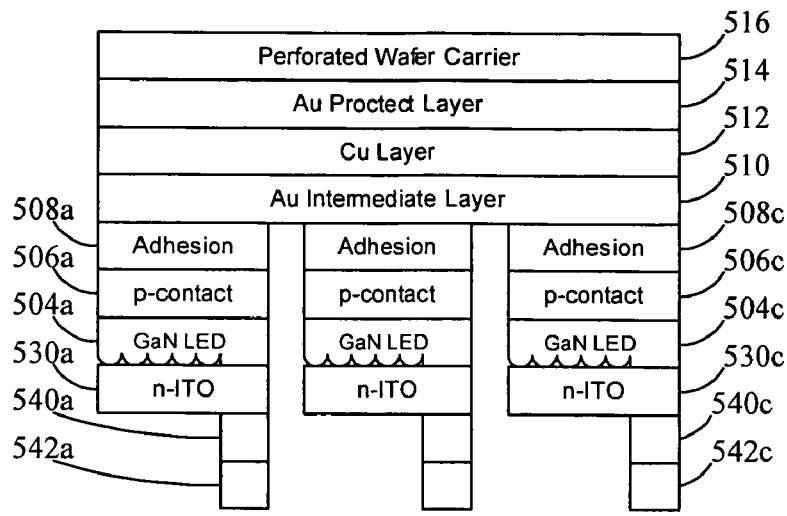
FIG. 11 depicts a technique for device isolation of a partially formed semiconductor structure according to an embodiment of the invention.

FIG. 11 depicts a technique for device isolation. After GaN surface cleaning, the individual devices are isolated by a MICP (magnetized inductively coupled plasma) dry etching technique. MICP can accelerate the etch rate compared with the other dry etching methods. This is particularly useful to prevent photo-resist burning during the etch process. MICP provides about twice the etch rate compared to conventional ICP. Fast etch rate is suggested for the processing of the vertical devices having metal support since the metal substrate can be attacked by chemicals designed for removing metal or oxide masks. Therefore, in order to use the photo-resist mask for the die isolation etching, fast etching technique is useful. The isolation trench dimension is 30 μm wide and 3.5 μm deep. MICP dry etch conditions for device isolation are as follow:

Total flow rate: 100 sccm
    Intensity of magnet field: 15 gauss
    Substrate temperature: 70° C.
    Gas mixture: 40% BC13/40% C12/20% Ar
    Power/bias voltage: 600 W/−300V
    Operational pressure: 30 mTorr
    Etch depth: 3.5 μm
    Etch mask: Photo-resist (AZ 9262) (thickness: 24 μm)

Figure 12:
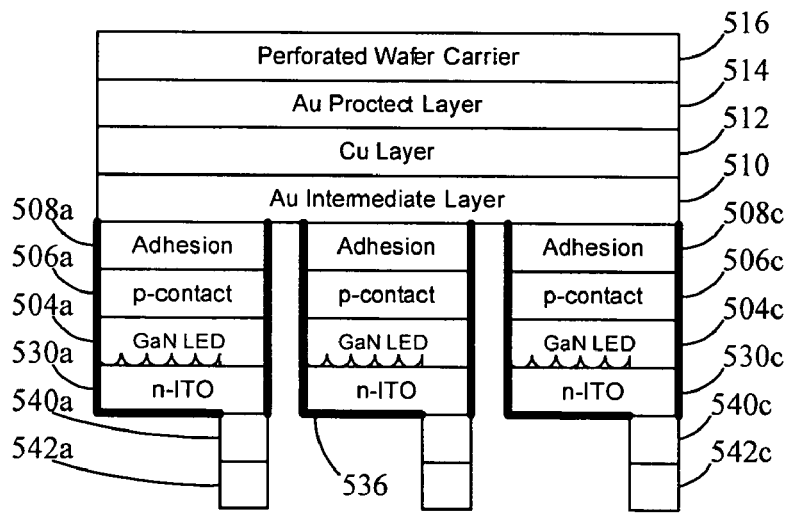
FIG. 12 depicts a technique for passivation deposition of a partially formed semiconductor structure according to an embodiment of the invention.

FIG. 12 depicts a technique for passivation deposition of a partially formed semiconductor structure according to an embodiment of the invention. Passivation layer 536 is deposited in order to protect device from the external hazardous environment and to increase the light output by modulating reflective index between the passivation layer and the GaN. In one aspect, the vertical device is passivated with $SiO_2$ thin film. The film is deposited with PECVD (Plasma Assisted Chemical Vapor Deposition) at 250° C. The film thickness is maintained at 80 nm for an optimal reflective index and transparency.

Figure 13:
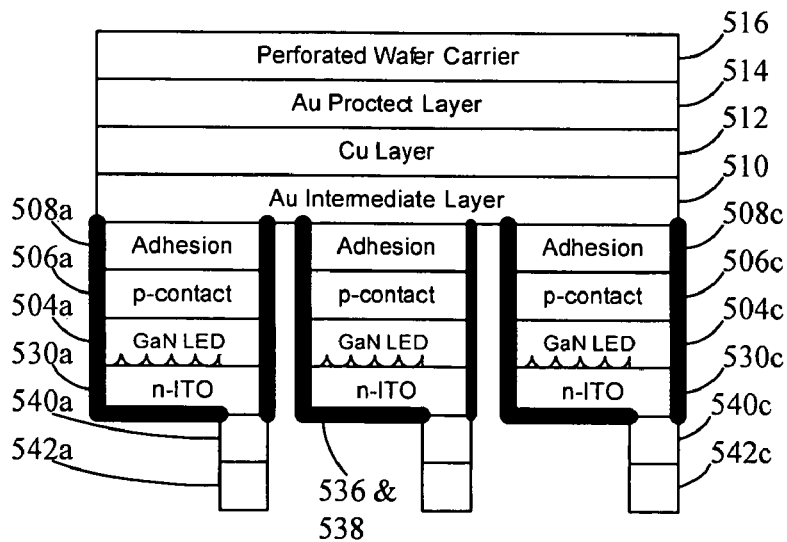
FIG. 13 depicts a technique for photoresist masking of a partially formed semiconductor structure according to an embodiment of the invention.

As shown in FIG. 13, the devices to be separated by the etching method are further protected with photo-resist (PR) films 538 over the $SiO_2$ passivation layer 536. The reason to further protect the device with PR is that chlorine-based Cu etchants used to separate the devices often attack the $SiO_2$ passivation layer as well as the ITO layers, which could result in device degradation after device separation. The PR thickness used is 6 μm. This PR layer is also unaffected during the Au pad open chemical process with BOE ($SiO_2$ etchant) solution.

Figure 14:
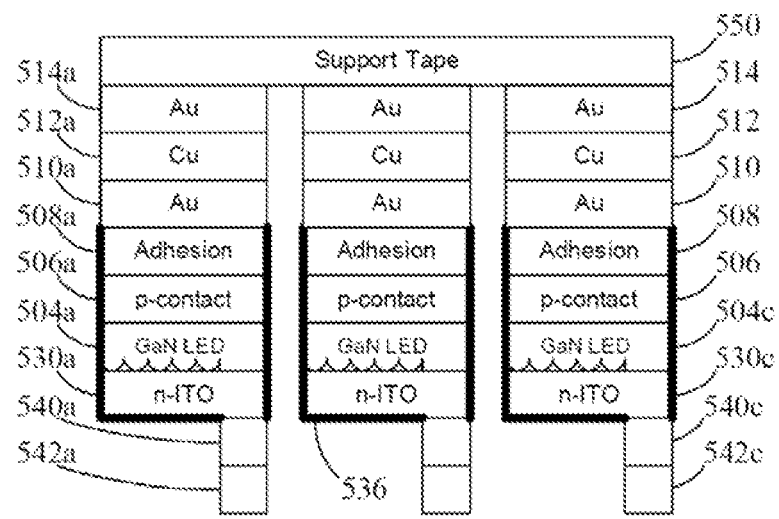
FIG. 14 depicts a technique for separating devices and supporting the devices on a support tape according to an embodiment of the invention.

As shown in FIG. 14, after the the passivation layer deposition and PR coating, the perforated support wafer carrier is removed from the GaN/metal support wafer using solvent. The de-bonding process is performed by soaking of GaN/metal wafer in acetone for 0.5~1 hour to dissolve the conductive adhesive layer from the perforated support wafer carrier. The separated GaN/metal wafers are further soaked and cleaned with isopropanol in the ultrasonic cleaner. The GaN device surface is further cleaned with DI water using rinse and dryer. The de-bonded wafers are attached to the polymer-base support film 550 mounted on the rigid corrosion-resistance metal or plastic rings to perform either the mask stripping or etching processes. In one aspect, standard blue support tape or UV support films are used in the invention.

Figure 15:
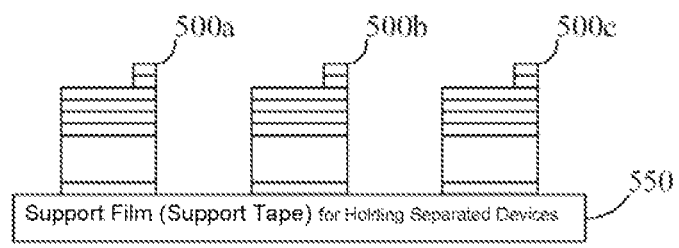
FIG. 15 depicts a plurality of separated devices according to an embodiment of the invention.

FIG. 15 depicts a plurality of finished devices according to an embodiment of the invention.

Figure 16:
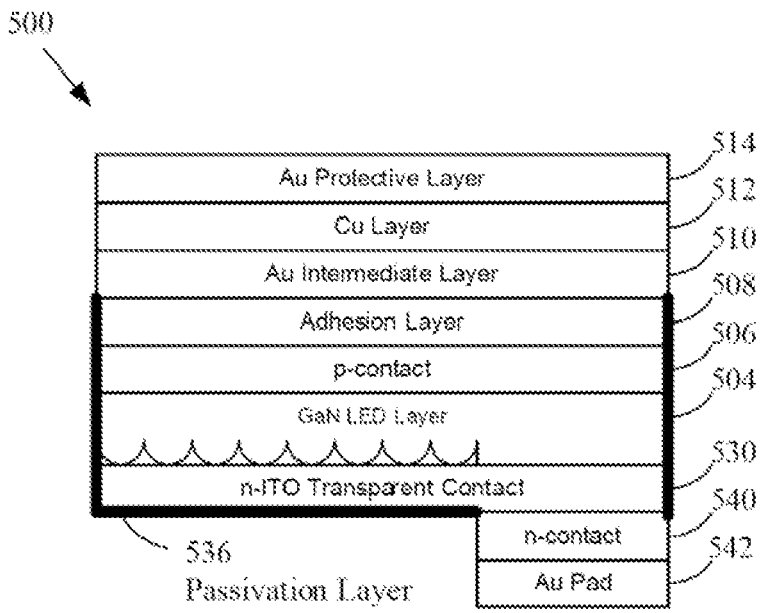
FIG. 16 depicts a finished final device according to an embodiment of the invention.

FIG. 16 depicts a finished device according to an embodiment of the invention.

Figure 17:
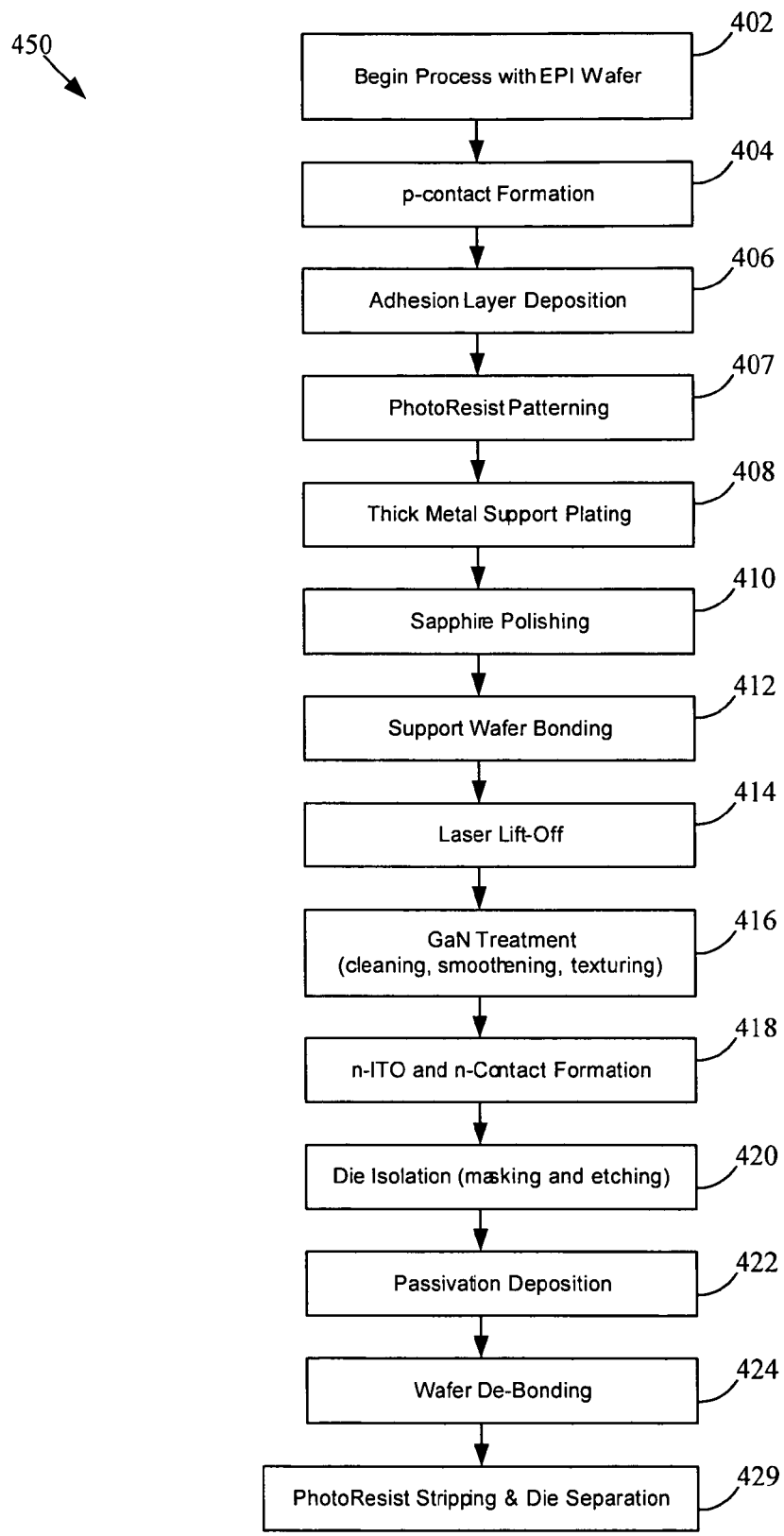
FIG. 17 depicts a flowchart showing steps for performing a method according to an embodiment of the invention.

FIG. 17 depicts a flowchart showing steps for performing a method according to an embodiment of the invention. In general this embodiment can be performed by masking the metal layer after deposition. In this case, the steps include partially forming a semiconductor structure attached to a support structure, the partially formed semiconductor structure comprising a plurality of partially formed devices.

Depositing a metal layer over the partially formed semiconductor structure. Finishing forming the semiconductor structure. Forming a mask layer over the surface of the metal layer, the mask layer formed in a plurality of rectangles leaving lanes where each of the devices are desired to be separated from each other. Removing the metal layer where the lanes are positioned, the mask layer protecting the metal layer under the rectangles. Separating the devices proximate to where the metal layer was removed. And, removing the mask layer from the devices. The method can also include the step of fixing the metal layer to a wafer carrier between certain steps of the process. The steps set forth herein are described in detail with reference to FIGS. 18-32. The FIG. 17 flowchart shows many steps in common with the FIG. 2 flowchart, thus, the description set forth above is applicable to many of the steps set forth in the FIG. 17 flowchart.

Figure 18:
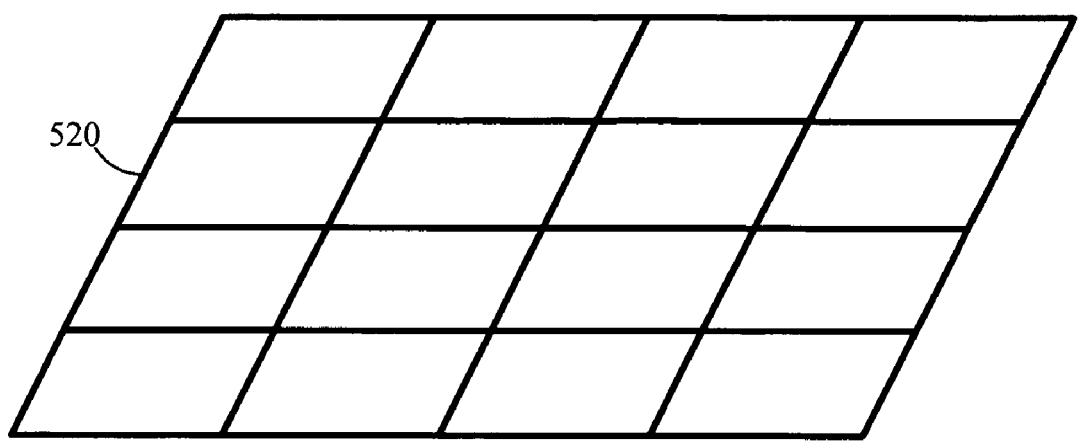
FIG. 18 depicts a masking layer for use with a partially formed semiconductor structure according to an embodiment of the invention.

FIG. 18 depicts a partial mask layer 520 for use with a partially formed semiconductor structure according to an embodiment of the invention. The exemplary pattern is a series of grid lines, or street lines (or lanes) that expose regions to become the semiconductor devices. The masking layer provides for separation between the devices as they are constructed so that they may be separated after construction.

Figure 19:
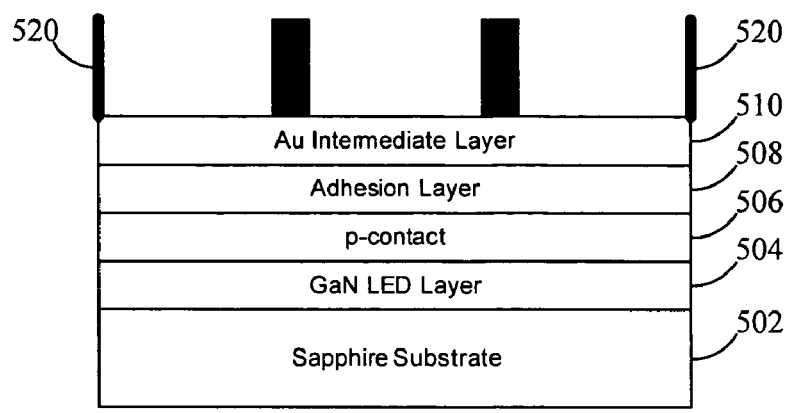
FIG. 19 depicts a partially formed semiconductor structure including an epitaxial wafer grown to a sapphire substrate and mask layer patterning according to an embodiment of the invention.

FIG. 19 depicts a partially formed semiconductor structure including an epitaxial wafer grown on a sapphire substrate according to an embodiment of the invention. For the semiconductor devices that are subjected to be separated by the pre-patterning separation method, the mask pattern is formed on the Au surface after Au intermediate layer deposition as shown in FIG. 19. The mask layer formed in a grid pattern leaving openings where each of the devices are desired to be formed. In one aspect, the mask is prepared by laying a uniform mask layer over the entire surface and then exposing and washing away undesired portions of the mask. Contrary to the conventional spin coated thin film photo-resist lithography method (<10 µm), dry film laminate-type thick film photo resist (>50 mm) is used in order to form a thick metal support films (>50 mm) underneath the GaN/p-metal/Cr or Ti/Au layers. The thick film photo-resist laminate is applied to Au intermediate layer surface with heat and pressure. The photolithography process is performed using the mask pattern having a 50 µm-wide device street width. After patterning and developing, network of mesh structure photo-resist thick films forms on the Au surface. This process can cover the device having device gap and device height as small as 30 µm wide and 30 µm high. This thick film photo resists remains up to the end of device fabrication process.

Figure 20:
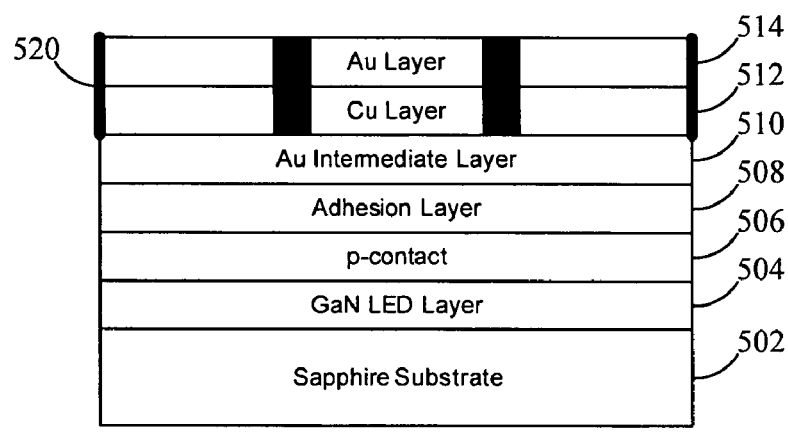
FIG. 20 depicts a partially formed semiconductor structure with metal layers deposited thereon according to an embodiment of the invention.

FIG. 20 depicts a partially formed semiconductor structure with metal layers deposited thereon according to an embodiment of the invention. The fabrication steps are similar to those described with reference to FIG. 4.

Figure 21:
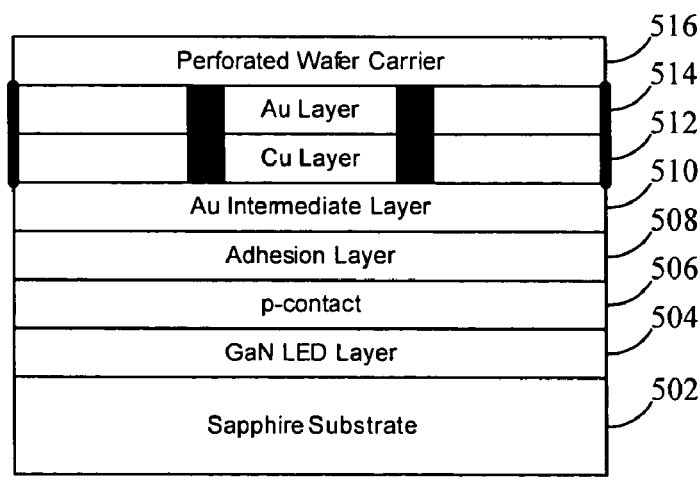
FIG. 21 depicts a partially formed semiconductor structure attached to a perforated wafer carrier according to an embodiment of the invention.

FIG. 21 depicts a partially formed semiconductor structure attached to a perforated wafer carrier according to an embodiment of the invention. The fabrication steps are similar to those described with reference to FIG. 5.

Figure 22:
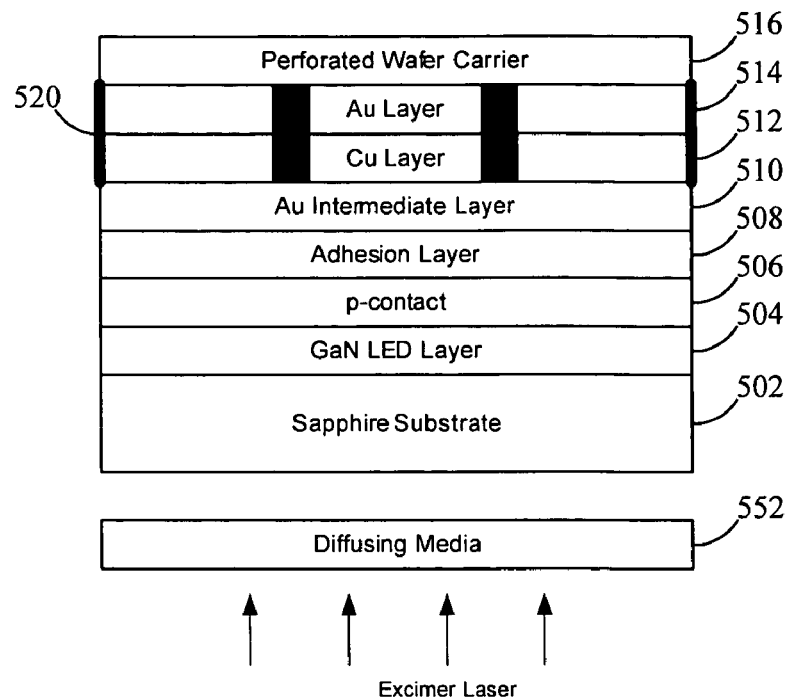
FIG. 22 depicts a technique for performing laser lift-off to remove the sapphire substrate from a partially formed semiconductor structure according to an embodiment of the invention.

FIG. 22 depicts a technique for performing laser lift-off to remove the sapphire substrate from a partially formed semiconductor structure according to an embodiment of the invention. The fabrication steps are similar to those described with reference to FIG. 6.

Figure 23:
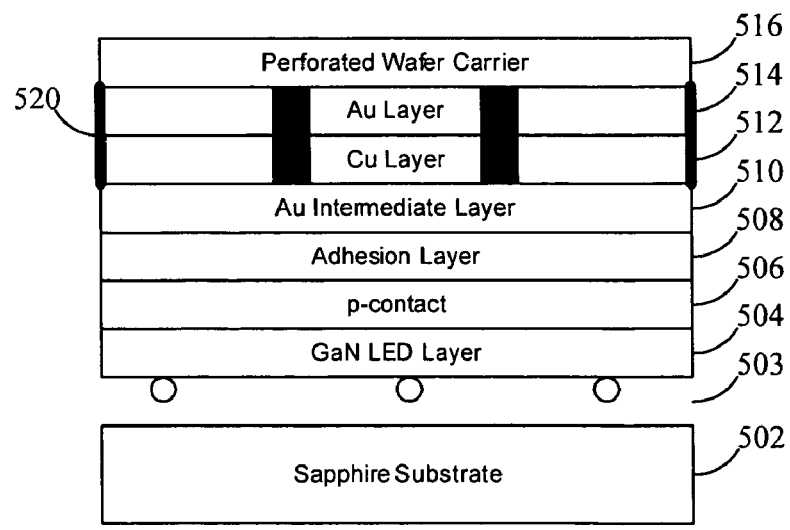
FIG. 23 depicts a technique for performing laser lift-off to remove the sapphire substrate from a partially formed semiconductor structure and also depicts Ga drops on the GaN surface after laser lift-off according to an embodiment of the invention.

FIG. 23 depicts a technique for performing laser lift-off to remove the sapphire substrate from a partially formed semiconductor structure and also depicts Ga drops on the GaN surface after laser lift-off according to an embodiment of the invention. The fabrication steps are similar to those described with reference to FIG. 7.

Figure 24:
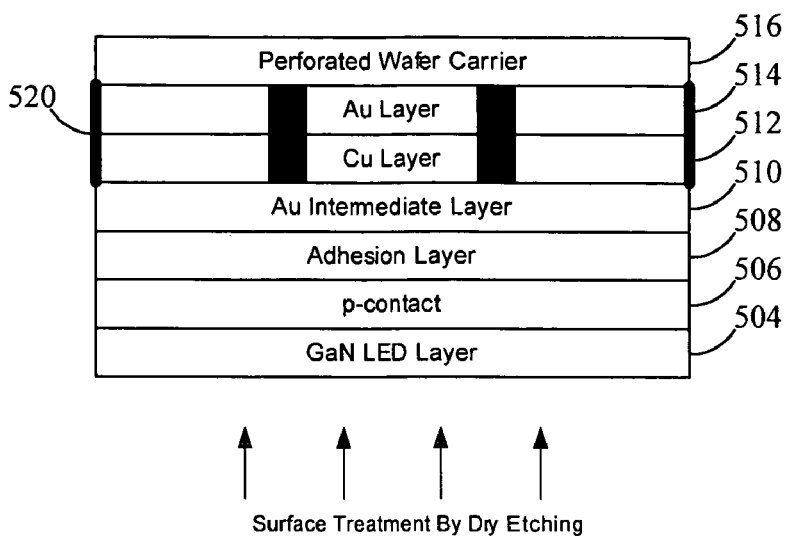
FIG. 24 depicts a technique for treating a GaN LED layer of a partially formed semiconductor structure according to an embodiment of the invention.

FIG. 24 depicts a technique for treating a GaN LED layer of a partially formed semiconductor structure according to an embodiment of the invention. The fabrication steps are similar to those described with reference to FIG. 8.

Figure 25:
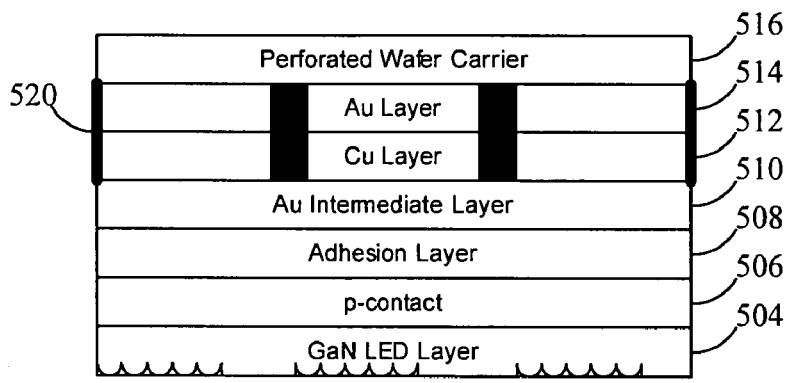
FIG. 25 depicts a partially formed_semiconductor structure according to an embodiment of the invention.

FIG. 25 depicts a partially formed semiconductor structure according to an embodiment of the invention. The fabrication steps are similar to those described with reference to FIG. 9.

Figure 26:
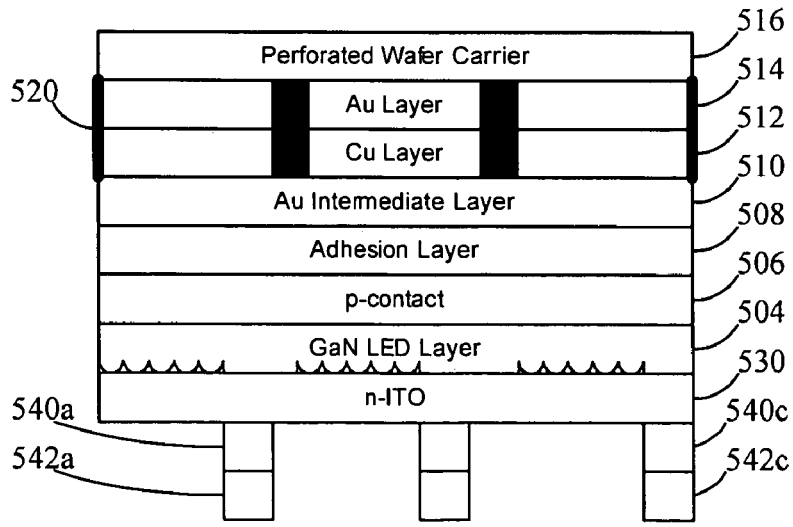
FIG. 26 depicts a partially formed semiconductor structure with contact pads attached thereon according to an embodiment of the invention.

FIG. 26 depicts a partially formed semiconductor structure with contact pads attached thereon according to an embodiment of the invention. The fabrication steps are similar to those described with reference to FIG. 10.

Figure 27:
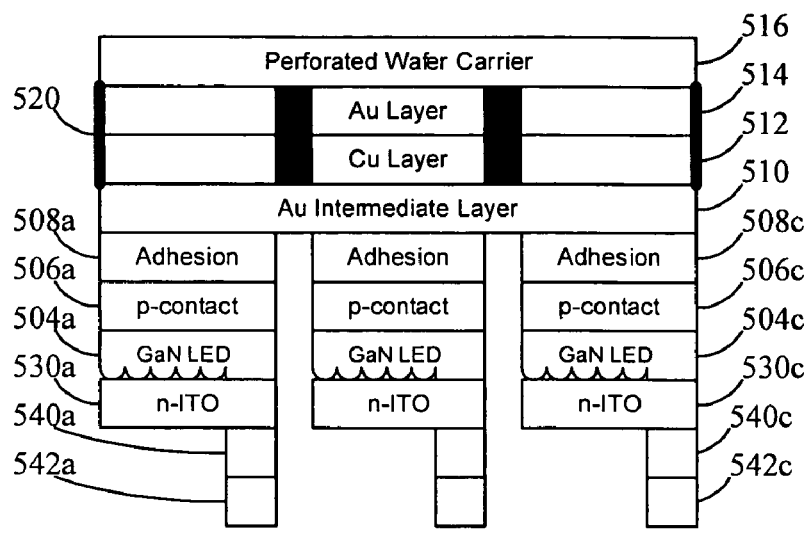
FIG. 27 depicts a technique for device isolation of a partially formed semiconductor structure according to an embodiment of the invention.

FIG. 27 depicts a technique for device isolation of a partially formed semiconductor structure according to an embodiment of the invention. The fabrication steps are similar to those described with reference to FIG. 11.

Figure 28:
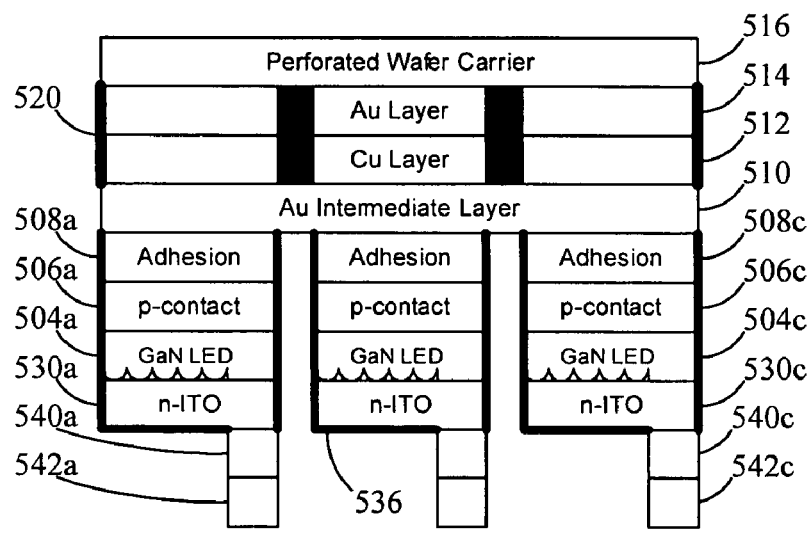
FIG. 28 depicts a technique for passivation deposition of a partially formed semiconductor structure according to an embodiment of the invention.

FIG. 28 depicts a technique for passivation deposition of a partially formed semiconductor structure according to an embodiment of the invention. The fabrication steps are similar to those described with reference to FIG. 12.

The pattern method does not include a step of depositing a photoresist layer as shown in FIG. 13 of the etch method. This is because the device separation steps set forth in the pattern method involve removing the pattern 520 between the devices rather than etching the metal layers 510, 512, 514.

Figure 29:
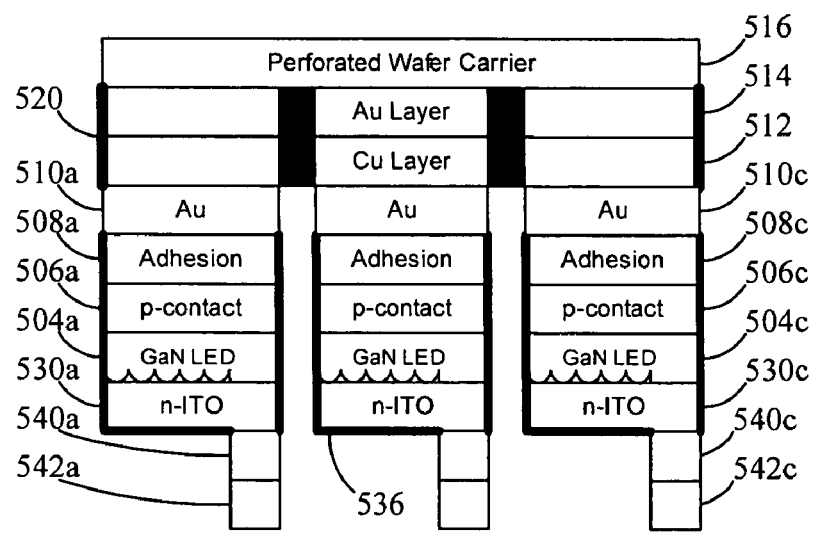
FIG. 29 depicts a technique for Au intermediate layer etching of a partially formed semiconductor structure according to an embodiment of the invention.

FIG. 29 depicts Au intermediate layer etching of a partially formed semiconductor structure according to an embodiment of the invention. The Au intermediate layer 510 is removed either during device isolation etching or using a specific gold etching chemical such as potassium chloride. Once the Au intermediate layer is removed along with streets, the device can then be separated by washing away the residual mask 520.

Figure 30:
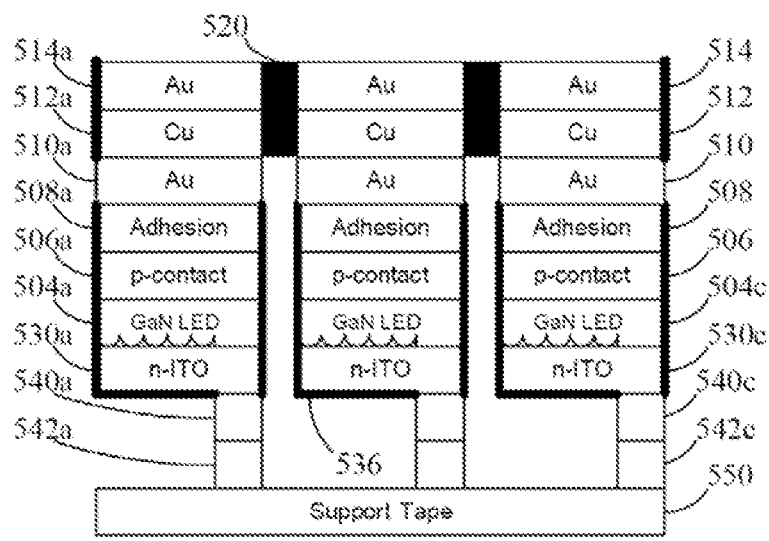
FIG. 30 depicts a technique for separating devices and supporting the devices on a support tape according to an embodiment of the invention.

FIG. 30 depicts a technique for separating devices and supporting the devices on a support tape according to an embodiment of the invention. This figure shows the original photo-resist mask 520 stripped or removed from the metal layer leaving a plurality of rectangular metal sections, which are the individual devices supported on the support tape after removal of the original photo-resist mask. The support tape is inert to the stripping chemicals. The result is easy separation of the devices with little or no damage to the devices.

Figure 31:
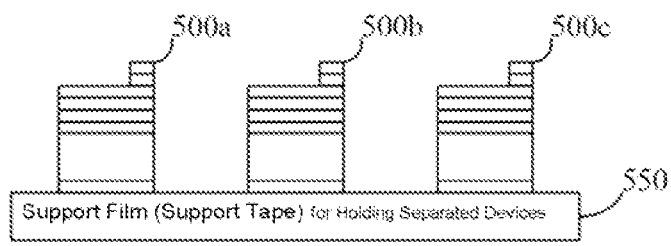
FIG. 31 depicts a plurality of finished devices according to an embodiment of the invention.

FIG. 31 depicts a plurality of finished devices according to an embodiment of the invention.

Figure 32:
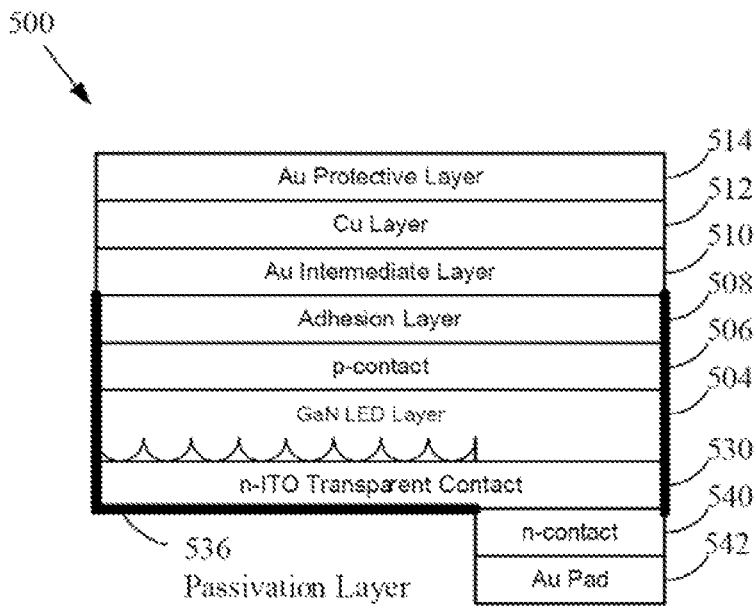
FIG. 32 depicts a finished device according to an embodiment of the invention.

FIG. 32 depicts a finished device according to an embodiment of the invention.

Advantages of the invention include higher yield than conventional techniques. In addition, less expensive equipment can be used to separate the devices. The result is a greater production of devices per unit of time and per dollar.

Having disclosed exemplary embodiments and the best mode, modifications and variations may be made to the disclosed embodiments while remaining within the subject and spirit of the invention as defined by the following claims.

The invention claimed is:

1. A method of fabricating and separating semiconductor structures comprising the steps of:
   (a) partially forming a semiconductor structure attached to a support structure, the partially formed semiconductor structure comprising a plurality of partially formed devices, where the partially formed devices are attached to one another by at least one connective layer;
   (b) forming a partial mask layer over at least a part of the partially formed devices;
   (c) etching the connective layer to separate the devices; and
   (d) removing the partial mask layer,
   wherein an Au layer can be etched away with gold etchant, such as potassium chloride.

2. The method of claim 1, further comprising the step of depositing an oxide passivation layer on at least a part of the partially formed devices between steps (a) and (b).

3. The method of claim 1, wherein step (a) includes the steps of forming a device mask layer over the devices, partially etching the semiconductor structure between the devices down to the at least one connective layer and removing the device mask.

4. The method of claim 1, further comprising the step of treating a GaN layer of the devices to create undulations thereon.

5. The method of claim 1, further comprising the step of separately mounting the devices on a polymer base support film which is inert to base etching chemicals and suitable for die expansion and consecutive packaging processes.

6. The method of claim 5, wherein the semiconductor devices are protected with a chemically inert oxide layer and a polymer layer prior to chemical etching.

7. The method of claim 6, wherein the oxide layer remains on the device Surface, while the polymer protective layer is stripped after device separation process.

8. The method of claim 5, wherein the etching chemicals is a solution comprising chlorine.

9. The method of claim 6, wherein etching method is either chemical jet spray or immersing in the etching solution.

10. A method of fabricating a semiconductor device, comprising the steps of:
(a) partially forming a semiconductor structure attached to a support structure, the partially formed semiconductor structure comprising, a plurality of partially formed devices;
(b) depositing a metal laser over the partially formed semiconductor structure;
(c) finishing forming the semicondudor structure;
(d) forming a mask layer over the surface of the metal layer, the mask layer formed in a plurality of rectangles leaving lanes where each of the devices are desired to be separated from each other;
(e) removing the metal layer where the lanes are positioned, the mask layer protecting the metal layer under the rectangles;
(f) separating the devices proximate to where the metal layer was removed; and
(f) removing the mask layer from the devices.

11. The method of claim 10, further comprising the step of fixing the metal layer to a wafer carrier between steps (b) and (c) and removing the metal layer from the wafer carrier between steps (c) and (d).

12. A method of fabricating and separating semiconductor structures comprising the steps of:
(a) partially forming a semiconductor structure attached to a support structure, the partially formed semiconductor structure a plurality of partially formed devices;
(b) forming a partial mask layer over the surface of the partially formed semiconductor structure, the partial mask layer formed in a grid pattern leaving openings where each of the devices are desired to be formed;
(c) depositing a metal layer over the partially formed semiconductor structure in the openings where the surface is not covered by the partial mask layer;
(d) finishing forming the semiconductor structure;
(e) removing the partial mask layer; and
(f) separating the devices proximate to where the partial mask layer was removed.

13. The method of claim 12, further comprising the step of fixing the metal layer to a wafer carrier between steps (c) and (d) and removing the metal layer from the wafer carrier between steps (d) and (e).

14. The method of claim 12, further comprising the step of depositing an oxide passivation layer on at least a part of the partially formed devices between steps (d) and (e).

15. The method of claim 12, wherein step (d) includes the steps of forming a device mask layer over the devices, partially etching the semiconductor structure between the devices down to the partial mask layer and removing the device mask.

16. The method of c aim 12, further comprising the step of treating a GaN layer of the devices to create undulations thereon.

17. The method of claim 12, further comprising the step of separately mounting the devices on a polymer base support him which is inert to base stripping chemicals and suitable for die expansion and consecutive packaging processes.

18. The method of claim 16, wherein the semiconductor devices are protected with a chemically inert oxide layer prior to chemical etching.

19. The method of claim 16, wherein the stripping chemicals is a solution comprising chlorine base acidic chemicals, such as $(OH)^-$ containing chemicals.

20. The method of claim 17, wherein etching method is either chemical jet spray or immersing in the etching solution.

21. The method of claim 17, wherein an Au layer can be etched away with cold etchant, such as potassium chloride.

* * * * *